United States Patent [19]
Akram

[11] Patent Number: 5,834,366
[45] Date of Patent: Nov. 10, 1998

[54] METHOD FOR FABRICATING MICROBUMP INTERCONNECT FOR BARE SEMICONDUCTOR DICE

[75] Inventor: Salman Akram, Boise, Id.

[73] Assignee: Micron Technology, Inc., Boise, Id.

[21] Appl. No.: 914,469

[22] Filed: Aug. 19, 1997

Related U.S. Application Data

[62] Division of Ser. No. 647,749, May 15, 1996, Pat. No. 5,808,360.

[51] Int. Cl.$^6$ .................................................. H01L 21/44
[52] U.S. Cl. ........................ 438/614; 438/612; 438/613; 438/656; 438/685; 438/688
[58] Field of Search .................................. 438/612–617, 438/653, 656, 678, 679, 685, 686, 687, 688

[56] References Cited

U.S. PATENT DOCUMENTS

| | | | |
|---|---|---|---|
| 3,809,625 | 5/1974 | Brown et al. | 204/15 |
| 4,927,505 | 5/1990 | Sharma et al. | 204/34.5 |
| 5,072,289 | 12/1991 | Sugimoto et al. | 357/68 |
| 5,073,117 | 12/1991 | Malhi | 439/71 |
| 5,088,190 | 2/1992 | Malhi | 29/843 |
| 5,090,118 | 2/1992 | Kwon et al. | 29/843 |
| 5,123,850 | 6/1992 | Elder et al. | 439/67 |
| 5,172,050 | 12/1992 | Swapp | 324/158 |
| 5,225,037 | 7/1993 | Elder et al. | 156/644 |
| 5,239,198 | 8/1993 | Lin et al. | 257/693 |
| 5,262,718 | 11/1993 | Svendsen et al. | 324/158 P |
| 5,289,631 | 3/1994 | Koopman et al. | 29/840 |
| 5,302,891 | 4/1994 | Wood et al. | 324/158 F |
| 5,367,253 | 11/1994 | Wood et al. | 324/158.1 |
| 5,376,584 | 12/1994 | Agarwala | 257/780 |
| 5,408,190 | 4/1995 | Wood et al. | 324/765 |
| 5,438,223 | 8/1995 | Higashi et al. | 257/774 |
| 5,440,240 | 8/1995 | Wood et al. | 324/765 |
| 5,461,261 | 10/1995 | Nishiguchi | 257/780 |
| 5,487,999 | 1/1996 | Farnworth | 437/7 |
| 5,656,858 | 8/1997 | Kondo et al. | 257/737 |

OTHER PUBLICATIONS

Yamamoto, Yasuhikio et al., "Evaluation of New Micro-–Connection System Using Microbumps", Nitto Denko Corp., Technical Paper, ISHM '93 Proceedings, pp. 370–378.

Miyake, Kiyoshi et al., "Connectivity Analysis of New 'Known Good Die' Connection System Using Microbumps", Technical Report, Nitto Denko Corp., pp. 1–7, 1994.

"Science Over Art. Our New IC Membrane Test Probe." Packard Hughes Interconnect Advertising Brochure, 1993.

*Primary Examiner*—John F. Niebling
*Assistant Examiner*—David A. Zarneke
*Attorney, Agent, or Firm*—Stephen A. Gratton

[57] ABSTRACT

A method for forming an interconnect for making a temporary or permanent electrical connection to a semiconductor dice is provided. The method includes forming a substrate with an insulating layer and a pattern of conductors thereon. The conductors are formed as a bi-metal stack including a barrier layer formed of an inert metal and a conductive layer formed of a highly conductive metal. Microbumps are formed on the conductors by deposition through a mask using an electroplating, electroless plating, screen printing or evaporation process. The interconnect can be used to provide a temporary electrical connection for testing bare semiconductor dice. Alternately the interconnect can be used for flip chip mounting dice for fabricating multi chip modules and other electronic devices.

14 Claims, 4 Drawing Sheets

METHOD FOR FABRICATING MICROBUMP INTERCONNECT FOR BARE SEMICONDUCTOR DICE

CROSS REFERENCE TO RELATED APPLICATIONS

This application is a division of application Ser. No. 08/647,749 filed May 15, 1996, now U.S. Pat. No. 5,808,360.

FIELD OF THE INVENTION

This invention relates generally to semiconductor manufacture and specifically to a method for fabricating a microbump interconnect for a bare semiconductor die.

BACKGROUND OF THE INVENTION

In the manufacture of unpackaged semiconductor dice it is sometimes necessary to make an electrical connection with the bond pads of the dice for testing or other purposes. For example, burn-in and full functionality tests are used to certify each unpackaged die as a known good die (KGD). During the test procedures, test apparatus for a single bare die (also referred to as carriers) take the place of conventional plastic or ceramic semiconductor packages. Exemplary test apparatus are disclosed in U.S. Pat. Nos. 5,302,891; 5,408,190 and 5,495,179 to Wood et al.

This type of test apparatus typically includes an interconnect component for making the temporary electrical connection between the die and test apparatus. For example, U.S. Pat. No. 5,483,741 to Akram et al. discloses an interconnect with silicon contact members. Another type of interconnect is formed with microbump contact members. For example, U.S. Pat. No. 5,487,999 to Farnworth discloses an interconnect for bare dice that includes microbump contact members. Interconnects with microbump contacts can be fabricated using TAB tape developed for tape automated bonding of semiconductor dice.

The microbump contact members comprise metal bumps formed on an insulative polyimide film. The microbumps can be formed on metal filled vias through the film using an electroplating process. In addition, conductors are also formed on the polyimide film to establish a circuit path to the microbumps. For forming an interconnect for testing bare dice, the polyimide film with the microbumps and conductive traces thereon, can be mounted to a rigid substrate.

With this type of microbump interconnect, the manufacturing process for the microbumps is complicated and requires specialized manufacturing equipment. Following the microbump manufacturing process, the polyimide film must be cut to shape and mounted on the substrate. This can also be a complicated and tedious process. In particular, the polyimide film is fragile and difficult to cut and to attach to the rigid substrate. In addition, an adhesive layer must be formed between the polyimide film and the rigid substrate. The thickness and compressive properties of the adhesive layer can effect the function of the microbump interconnect. Accordingly, undesirable variables can be introduced by the procedures and materials used during the substrate mounting process.

The present invention is directed to a simplified method for forming microbump interconnects directly on a rigid substrate. This eliminates a separate substrate mounting step for microbumps and conductors formed on a polymer film. In addition, fabrication of the microbumps is simplified and an improved low resistance microbump contact is provided.

In view of the foregoing, it is an object of the present invention to provide an improved method for forming a microbump interconnect for bare semiconductor dice.

It is a further object of the invention to provide an improved method for forming a microbump interconnect comprising a substrate with conductors and low resistance microbumps formed thereon using semiconductor circuit fabrication techniques.

It is yet another object of the present invention to provide an improved microbump interconnect useful for making a temporary or permanent electrical connection to a bare semiconductor die.

It is a still further object of the present invention to provide an improved microbump interconnect that can be used in a test apparatus for testing bare dice or that can be used for flip chip mounting semiconductor dice to form multi chip modules and other electronic devices.

Other objects, advantages and capabilities of the present invention will become more apparent as the description proceeds.

SUMMARY OF THE INVENTION

In accordance with the present invention, an improved method for forming a microbump interconnect for bare semiconductor dice, and an improved microbump interconnect for bare dice are provided. Initially, a rigid substrate is formed of monocrystalline silicon, or other material having a coefficient of thermal expansion (CTE) similar to the CTE of the die. Preferably the substrate is a wafer of material such than a large number of interconnects can be formed using semiconductor circuit fabrication techniques and then singulated.

Following formation of the substrate, an electrically insulating layer (e.g., polyimide, $SiO_2$) is formed on the substrate. The insulating layer protects and insulates the substrate. This step is followed by blanket deposition of a bi-metal stack onto the insulating layer. The bi-metal stack includes an outer conductive layer formed of a highly conductive metal, such as copper or aluminum, overlaid on a barrier layer formed of an inert metal such as a titanium or an alloy of titanium (e.g., TiW, TiN). The conductive layer provides a low resistance electrical path and a suitable wire bonding metallurgy. The barrier layer provides adhesion to the substrate and prevents diffusion of the conductive layer into the substrate. In addition, the barrier layer can provide a nucleation surface for deposition of the conductive layer. After being blanket deposited, the bi-metal stack is patterned and etched to form a pattern of bi-metal conductors.

Following formation of the conductors, a resist mask is deposited on the conductors and substrate and developed with a pattern of openings to the conductors. Microbumps are then formed in the openings by filling the openings with metal using an electroplating, electroless plating, screen printing or evaporation process. Preferred materials for the microbumps include copper, nickel, gold, palladium and solder. Optionally, a cap layer comprising an inert metal, such as palladium, gold or platinum, can be formed on the surface of the microbumps.

The completed interconnect includes: a substrate having an electrically insulating layer formed thereon; a pattern of bi-metal conductors formed on the insulating layer; and microbumps formed on the conductors. The interconnect can be used in a testing apparatus to provide a temporary electrical connection for testing a bare semiconductor die. Alternately, the interconnect can be used for flip chip mounting one or more bare dice to provide a permanent electrical connection in the fabrication of multi chip modules or other electronic devices.

DETAILED DESCRIPTION OF THE PREFERRED EMBODIMENT

Figure 1A:
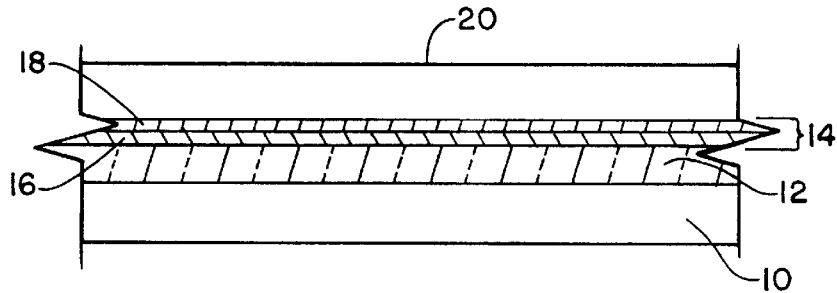
FIGS. 1A–1D are schematic cross sectional views of steps in a method for forming a microbump interconnect in accordance with the invention.

Referring to FIGS. 1A–1D, steps in the method of the invention are illustrated. Initially as shown in FIG. 1A, a substrate 10 is formed or provided. The substrate 10 is formed of a material having a coefficient of thermal expansion (CTE) that closely matches the CTE of a silicon die. Suitable materials for the substrate include monocrystalline silicon, silicon-on-glass, silicon-on-sapphire, germanium, ceramic and FR-4 materials. Preferably the substrate 10 is a wafer of material and a large number of interconnects are formed on the substrate and then singulated by saw cutting or other suitable process.

As also shown in FIG. 1A, an insulating layer 12 is formed on the substrate 10 to protect and insulate the substrate. The insulating layer 12 can be formed of an electrically insulating material such as an oxide, dielectric or insulating polymer. A representative thickness for the insulating layer 12 can be from about 1000 Å to 10 $\mu$m. By way of example, the insulating layer 12 can be silicon dioxide ($SiO_2$) deposited using a CVD process. With a CVD process, TEOS (tetraethylorthosilane) can be injected into a reaction chamber to grow silicon dioxide ($SiO_2$) at a temperature of about 400° C. The insulating layer 12 can also be formed by exposing the substrate 10 to an oxidizing atmosphere in a reaction chamber. Furthermore, the insulating layer 12 can be formed of a dielectric material, such as $Si_3N_4$, deposited using CVD or other deposition process. Still further, the insulating layer 12 can be formed of polyimide, or similar electrically insulating polymeric material, spun on or otherwise deposited on the substrate 10. In the case of a polymeric material, the natural resiliency of the material allows the insulating layer 12 to function as a compliant layer. This compliancy will allow the subsequently formed microbumps 30 (FIG. 1D) to flex to accommodate dimensional variations in the z-direction.

Figure 1B:
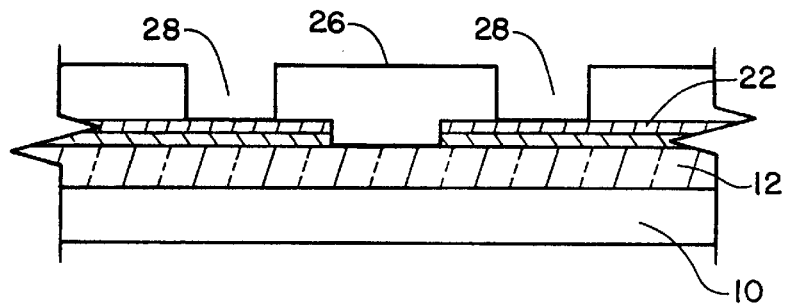

Following formation of the insulating layer 12, and as shown in FIG. 1B, a bi-metal stack 14 is blanket deposited over the substrate 10 and insulating layer 12. The bi-metal stack 14 includes a barrier layer 16 formed on the insulating layer 12 and a conductive layer 18 formed on the barrier layer 16.

The barrier layer 16 can be formed of an inert metal such as a titanium (Ti) or an alloy of titanium such as TiW or TiN. Other suitable materials for the barrier layer 16 include tungsten (W), and alloys of tungsten such as WN. The barrier layer 16 provides adhesion to the substrate 10 and prevents diffusion of the conductive layer 18 into the substrate 10. The barrier layer 16 can be blanket deposited using a suitable deposition process such as CVD, sputtering, or plating. A representative thickness for the barrier layer 16 is from 200 Å to 1 $\mu$m.

Figure 1C:
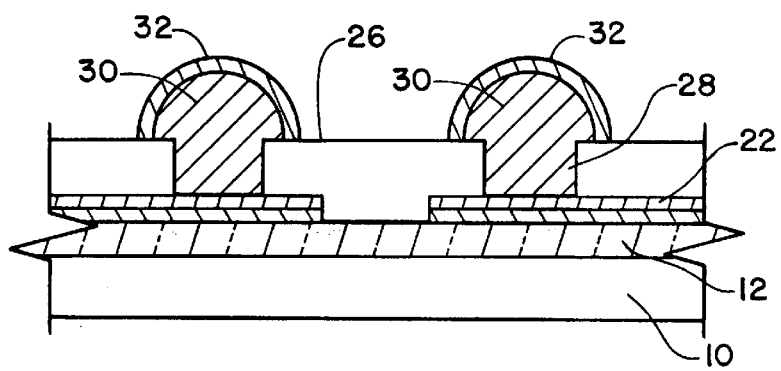

The conductive layer 18 is then blanket deposited on the barrier layer 16. The conductive layer 18 is preferably formed of a highly conductive metal such as copper or aluminum or alloys thereof, or a refractory metal such as titanium, tantalum, tungsten or molybdenum or alloys of these metals. The conductive layer 18 can be blanket deposited on the barrier layer 16 by CVD or sputtering. The conductive layer 18 can also be deposited in the barrier layer 16 using electroplating or electroless plating. In this case, the barrier layer 16 can function as a nucleation surface for forming the conductive layer 18. In a similar manner the conductive layer 18 can function as a nucleation surface for subsequent formation of microbumps 30 (FIG. 1C). A representative thickness for the conductive layer 18 can be from about 200 Å to 10 $\mu$m.

Still referring to FIG. 1A, following blanket deposition of the conductive layer 18, a layer of photoresist 20 is deposited on the conductive layer 18 and developed. The layer of photoresist 20 can be deposited using a spin-on process and then soft baked to drive out solvents. A typical thickness for the layer of photoresist 20 can be about 1,000 Å to 30,000 Å. Following the softbake, the layer of photoresist 20 is aligned with a mask and exposed using collimated UV light.

Next, the layer of photoresist 20 (FIG. 1A) is developed to form a resist mask (not shown) which is used to etch the conductive layer 18 and barrier layer 16 to form a pattern of bi-metal conductors 22 (FIG. 1B). Depending on the material used to form the conductive layer 18 and barrier layer 16, a suitable wet etch process can be used to etch the conductive layer 18 and barrier layer 16 to form the conductors 22. As an example, for a conductive layer 18 formed of aluminum and a barrier layer 16 formed of TiN, a wet etchant such as $H_3PO_4$ followed by $NH_4OH$ can be used to etch the pattern of conductors 22.

Figure 2:
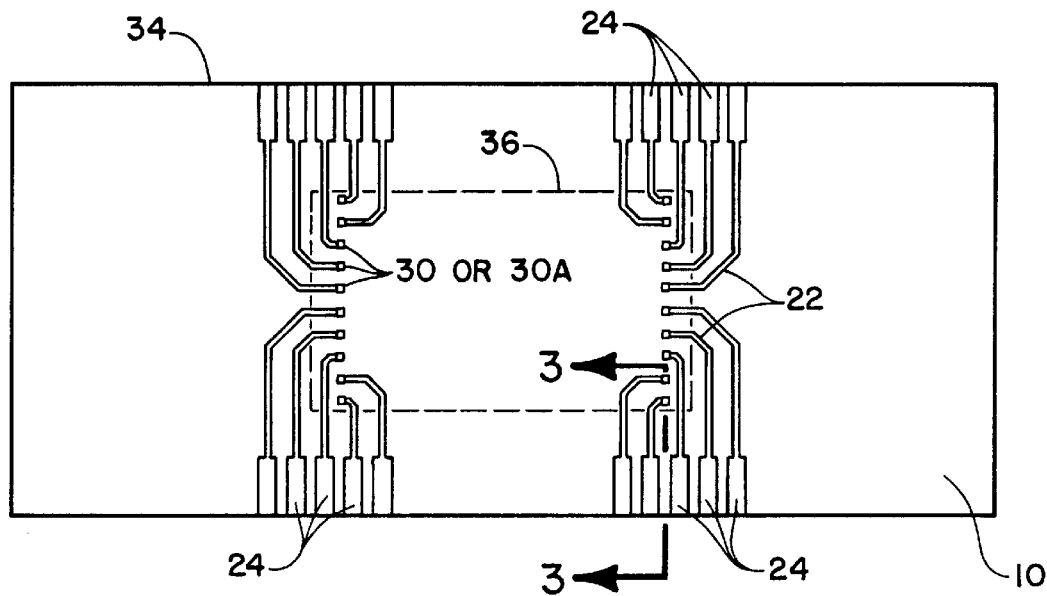
FIG. 2 is a plan view of the completed microbump interconnect.

The pattern of the conductors 22 is clearly shown in FIG. 2. Each conductor 22 can include a bonding site 24 (FIG. 2). As will be further explained, the bonding sites 24 are for wire bonding or otherwise providing an electrical path to the conductors 22.

Following formation of the bi-metal conductors 22, the layer of photoresist 20 (FIG. 1A) is stripped. The layer of photoresist 20 can be stripped using a suitable wet etchant along with organic ashing. For a positive resist, a solvent such as acetone, methylethylketone or 1-methylethylketone can be used. For a negative resist, a solution that will not attack the underlying metal can be used.

Figure 3:
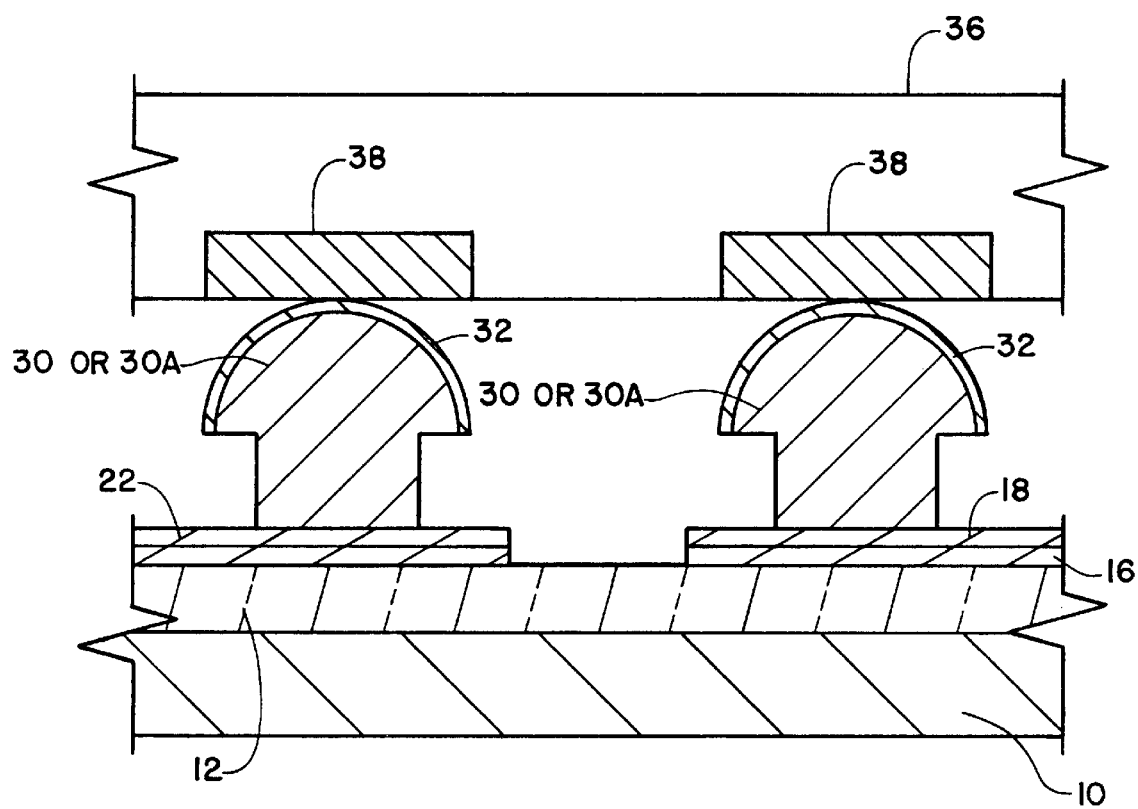
FIG. 3 is an enlarged cross sectional view taken along section line 3—3 of FIG. 2.

Referring to FIG. 1B, following formation of the conductors 22, a second layer of photoresist is deposited and patterned as previously described to form a resist mask 26. The resist mask 26 includes a pattern of openings 28 that align with the conductors 22. Preferably the openings 28 are located near a terminal end of the conductors 22. The location of the openings 28 corresponds to a pattern of bond pads 38 (FIG. 3) on a semiconductor die 36 (FIG. 3).

Next, as shown in FIG. 1C, microbumps 30 are formed on the conductors 22 by filling the openings 28 with metal. Suitable metals include copper, nickel, gold and palladium. One method for forming the microbumps 30 is with an electroplating process. Equipment and solutions used for electroplating the above metals are well known in the art.

Another method is with an electroless plating process. With electroless plating, an aqueous solution comprising metal ions and reducing agents is used. These solutions are also known in the art. For example, electroless plating of nickel can be performed using a solution containing Ni ions and a reducing agent such as hypophosphite or dimethylamine borane. Electroless plating of copper can be performed using a solution containing Cu ions and a suitable reducing agent.

As clearly shown in FIG. 1C, the microbumps 30 can have a height that is greater than the depth of the openings 28. A representative height of the microbumps 30 can be from 1 to 60 µm. In the embodiment illustrated in FIG. 1C, the microbumps 30 are generally mushroom shaped with a convex tip portion formed on the surface of the mask 26. Each convex tip portion has an outside diameter that is larger than the inside diameter of the corresponding opening 28 but smaller than the bond pads 38 (FIG. 3) on a semiconductor die 36 (FIG. 3). This shape can be formed by controlling parameters of the electroplating or electroless plating process. A representative outside diameter for the tip portions of the microbumps 30 can be from 15–100 µm depending on the size of the bond pads 38 (FIG. 3). A spacing for the microbumps 30 will also depend on the die bond pad spacing but can be from 25–250 µm or greater.

Following formation of the microbumps 30, a cap layer 32 can optionally be formed on the exposed tip portion of the microbumps 30. The cap layer 32 can be formed of an inert metal that will inhibit oxidation and diffusion of the metal which forms the microbump 30. The cap layer 32 can be formed using an electroplating or electroless plating process. Suitable metals for forming the cap layer include palladium, gold, and platinum. A representative thickness for the cap layer 32 can be from 100 Å to 2 µm.

Figure 1D:
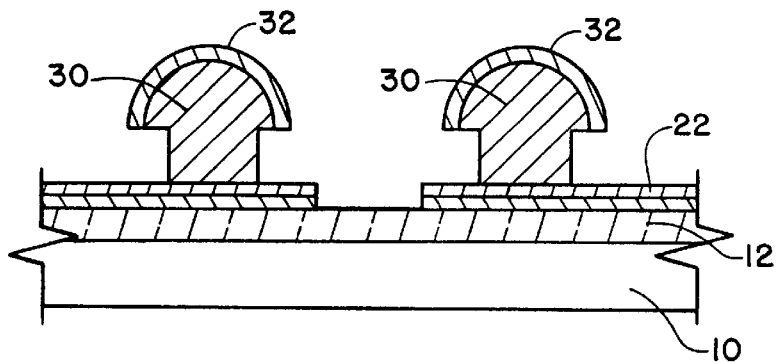

Following formation of the microbumps 30 and as shown in FIG. 1D, the resist mask 26 is stripped as previously described. This completes the interconnect 34 which is shown in FIG. 2.

Figure 1E:
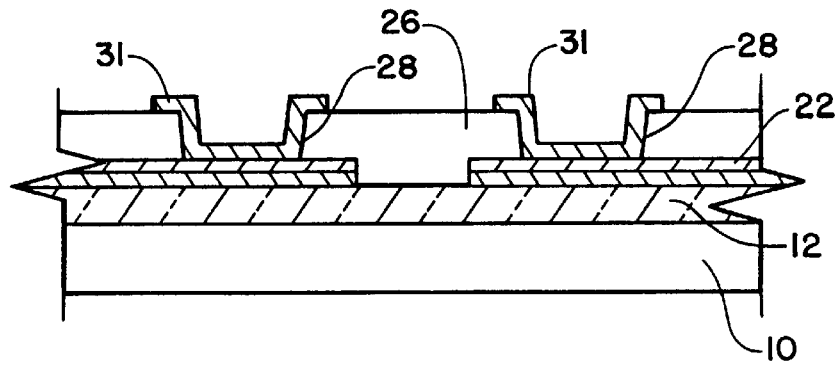
FIGS. 1E–1G are schematic cross sectional views equivalent to FIGS. 1B–1D respectively of an alternate embodiment method for forming a microbump interconnect in accordance with the invention.
Figure 1F:
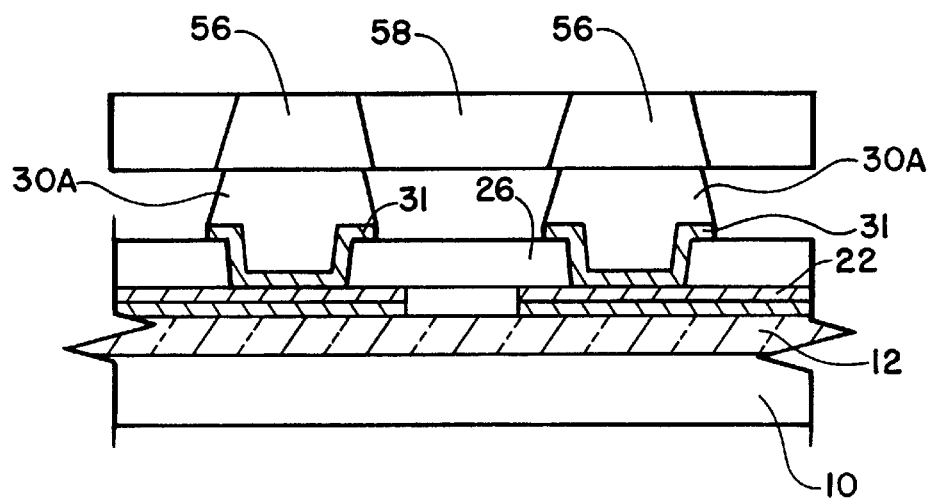

Referring to FIGS. 1E–1F, an alternate process for forming solder microbumps 30A (FIG. 1G) is shown. In this case, the solder microbumps 30A are formed of a solder material, such as PbSn, InSn or SbSn deposited on contacts 31 formed of a solder wettable material. As shown in FIG. 1E, the substrate 10, insulating layer 12 and bi-metal conductors 22 have been formed as previously described. In addition, the resist mask 26 with openings 28 have been formed as previously described.

For forming the solder microbumps 30A, the contacts 31 are formed in the openings 28 in contact with the conductors 22. The contacts 31 can be formed using an electroless plating process or a thin film deposition process such as evaporation, sputtering or CVD and patterning of a thin film. The contacts 31 are formed of a solder wettable metal such as copper, chromium or gold to which a subsequently deposited solder will adhere.

As shown in FIG. 1F, following formation of the contacts 31, the solder microbumps 30A are formed on the contacts 31 by screen printing or evaporation through openings 56 in a mask 58. With a screen printing process, the mask 58 is placed on or in close proximity to the substrate 10 and the solder material is forced through the openings 56 in the mask 58 onto the contacts 31. With evaporation, the solder material is evaporated through the openings 56 in the mask 58 onto the contacts 31. Evaporation through the openings 56 in the mask 58 can be similar to formation of a ball limiting metallurgy pad (BLM) for bumped dice.

Figure 1G:
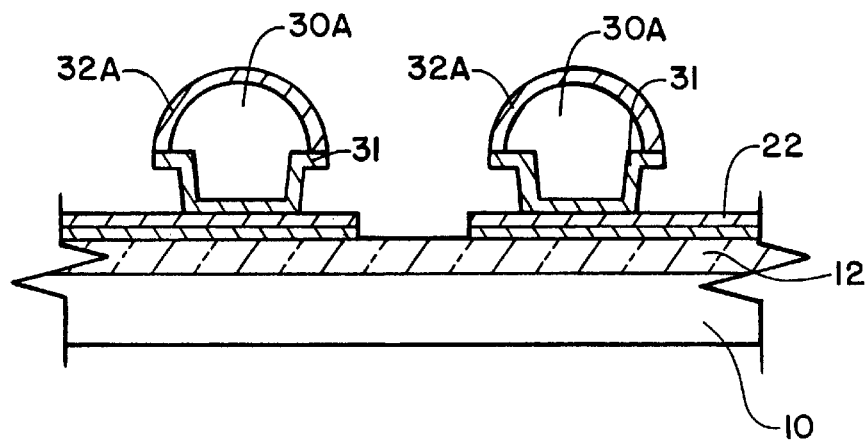

A preferred solder material for the solder microbumps 30A is a PbSn solder (e.g., 67%Pb-33%Sn). Other alloys based on tin (Sn), silver (Ag), copper (Cu) and indium (In) metallurgy can also be used. An exemplary alloy would be 77.2% (Sn), 2.8% (Ag) and 20% (In). The solder microbumps 30A can initially have a straight wall profile but can subsequently be thermally reflowed into a spherical, hemispherical or generally convex shape. For example, reflow in an $H_2$ ambient at a temperature of about 300° C. melts and homogenizes the solder microbumps 30A and forms a spherical, hemispherical or generally convex shape. An exemplary reflowed shape of the microbumps 30A is shown in FIG. 1G. Optionally, a cap layer 32A can be formed on the reflowed microbumps 30A by plating an inert material such as palladium, gold, or platinum as previously described.

FIG. 2 illustrates the completed interconnect 34 comprising the substrate 10, bi-metal conductors 22 and microbumps 30 (or 30A). In the completed interconnect 34, the placement of the microbumps 30 (or 30A) matches the placement of the bond pads 38 (FIG. 3) on a semiconductor die 36 (FIG. 3). In addition, the conductors 22 extend in a pattern to the outside edges of the interconnect 34.

FIG. 3, is an enlarged cross sectional view illustrating the interaction between the microbumps 30 (or 30A) and the bond pads 38 on the die 36. The interconnect 34 is adapted to make either a temporary or a permanent electrical connection to the die 36. With a temporary electrical connection, the microbumps 30 (or 30A) merely contact the bond pads 38. With a permanent electrical connection the microbumps 30 (or 30A) can be bonded to the bond pads 38 using heat and pressure.

Figure 4:
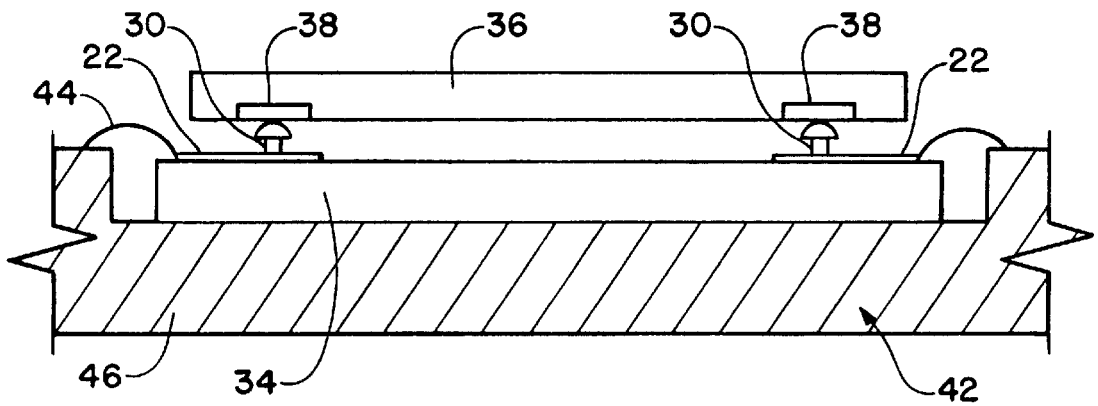
FIG. 4 is a schematic view of the interconnect mounted within a testing apparatus.
Figure 5:
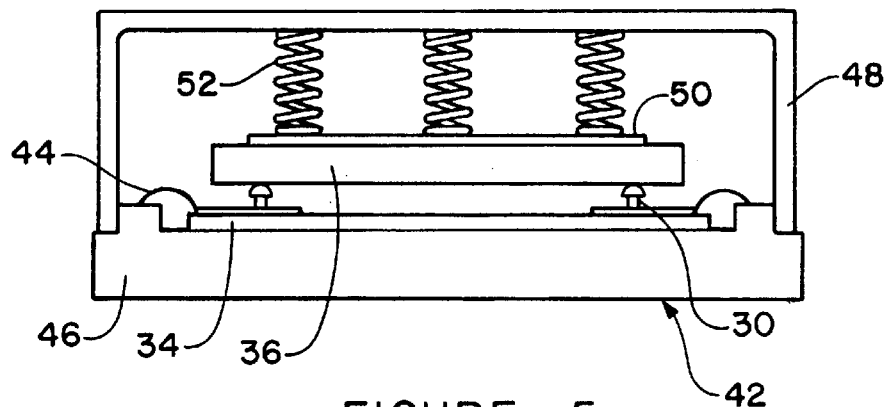
FIG. 5 is a schematic view of the testing apparatus with the interconnect mounted therein.

Referring to FIGS. 4 and 5, the interconnect 34 is shown mounted to a test fixture 42 configured to test the die 36. The test fixture 42 includes a base 46 for retaining the interconnect 34 and the die 36. An electrical path is provided between the interconnect 34 and the base 46 using bond wires 44. The bond wires 44 can be wire bonded to the conductors 22 on the interconnect 34 and to corresponding conductors or external test circuitry operably associated with the test fixture 42.

As shown in FIG. 5, the test fixture 42 can include a force applying mechanism 48 for biasing the die 36 and interconnect 34 together. The force applying mechanism 48 can include a pressure plate 50 for contacting the die 36 and springs 52 for applying a biasing force.

Figure 6:
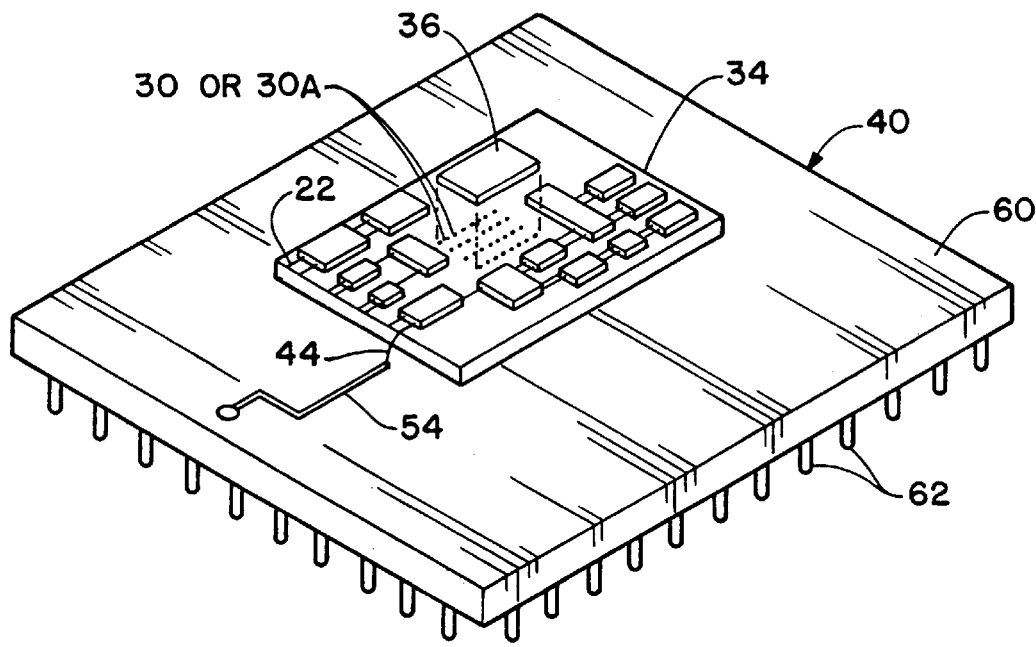
FIG. 6 is a perspective view of a multi chip module including an interconnect constructed in accordance with the invention.

Referring to FIG. 6, a multi chip module 40 constructed using an interconnect 34 formed substantially as previously described is shown. In this application, the electrical connection between the bond pads 38 (FIG. 3) on the dice 36 and the microbumps 30 (or 30A) on the interconnect 34 is permanent. The multi chip module 40 includes a ceramic base 60 having a plurality of external contacts 62. The interconnect 34 can be secured to the ceramic base 60 using an adhesive. In addition, bond wires 44 are wire bonded to the conductors 22 on the interconnect 34 and corresponding conductors 54 on the ceramic base 60.

In this embodiment, the interconnect 34 is configured to flip chip mount a plurality of dice 36. In addition, the conductors 22 on the interconnect 34 are configured to provide a desired circuit path between the dice 36. The conductors 22 are also configured to provide a desired circuit path to the conductors 54 on the ceramic base 60 of the multi chip module 40. The dice 36 can be flip chip mounted to the microbumps 30 (or 30A) using flip chip optical alignment techniques and apparatus. U.S. Pat. No. 5,634,267, incorporated herein by reference, describes an optical alignment technique for aligning the bond pads 38 on the dice 36 to the microbumps 30 (or 30A) on the interconnect 34.

Following alignment of the dice 36 and interconnect 34, the dice 36 are permanently bonded to the microbumps 30 (or 30A). A preferred method of bonding is with a reflow thermal cycle. This can be accomplished one die 36 at a time using a localized heat source, or on all of the dice 36 at once using an oven. The reflow bonding process is preferably performed with the interconnect 34 having solder microbumps 30A as previously described. During the reflow thermal cycle, the solder microbumps 30A melt and permanently bond to the bond pads 38 (FIG. 3) on the dice 36. Following the bonding process flux residues can be cleaned with solvents that are known in the art. This is followed by electrical testing of the multi chip module 40.

Thus the invention provides an improved method for forming a microbump interconnect and an improved microbump interconnect. The method is characterized by its simplicity and adaptability to volume manufacture using semiconductor circuit fabrication techniques. In addition, the resultant interconnect is characterized by low resistance microbumps and conductors.

Although the method of the invention has been described with reference to certain preferred embodiments, as will be apparent to those skilled in the art, certain changes and modifications can be made without departing from the scope of the invention as defined by the following claims.

What is claimed is:

1. A method for fabricating an interconnect for a semiconductor die comprising:

providing a substrate;

forming an electrically insulating polymer layer on the substrate;

forming a plurality of conductors on the polymer layer;

forming a mask on the substrate comprising a plurality of openings to the conductors corresponding to a pattern of contacts on a die;

forming microbumps on the conductors by depositing a metal in the openings, the microbumps configured to electrically engage the contacts on the die and to flex with the polymer layer to accommodate dimensional variations in the microbumps and contacts; and removing the mask.

2. The method of claim 1 wherein the substrate comprises silicon and the polymer layer comprises polyimide.

3. The method of claim 1 wherein the microbumps are configured to flex to accommodate z-direction dimensional variations.

4. A method for fabricating an interconnect for a semiconductor die comprising:

providing a substrate;

forming an electrically insulating polymer layer on the substrate;

forming a plurality of conductors on the polymer layer;

forming a mask on the substrate comprising a plurality of openings to the conductors corresponding to a pattern of contacts on the die;

forming microbumps on the conductors by depositing a metal in the openings, the microbumps configured to electrically enrage the contacts on the die and to flex with the compliant layer to accommodate z-direction dimensional variations in the microbumps and contacts; and removing the mask.

5. The method of claim 4 further comprising bonding the microbumps to the contacts.

6. The method of claim 4 further comprising placing the substrate in a test fixture configured to test the die.

7. A method for fabricating an interconnect for a semiconductor die comprising:

providing a substrate;

forming an electrically insulating polymer layer on the substrate;

forming a plurality of conductors on the polymer layer;

forming a mask on the substrate comprising a plurality of openings on the conductors corresponding to a pattern of contacts on the die;

depositing a metal in the openings to form a plurality of microbumps configured to electrically engage the contacts on the die and to flex with the polymer layer to accommodate z-direction dimensional variations in the microbumps and contacts;

removing the mask; and placing the substrate in a test fixture configured to test the die.

8. The method of claim 7 wherein the substrate comprises silicon.

9. The method of claim 7 wherein the substrate comprises silicon and the polymer layer comprises polyimide.

10. A method for fabricating a multi chip module comprising:

providing a die comprising a plurality of contacts;

providing a substrate;

forming an electrically insulating polymer layer on the substrate;

forming a plurality of conductors on the polymer layer;

forming a mask on the substrate comprising a plurality of openings to the conductors;

forming microbumps on the conductors by depositing a metal in the openings;

removing the mask;

placing the die on the substrate with the microbumps electrically contacting the contacts and flexing with the compliant layer to accommodate z-direction dimensional variations in the microbumps and contacts; and bonding the microbumps to the contacts.

11. The method of claim 10 wherein the metal comprises solder.

12. The method of claim 10 bonding the microbumps comprises flip chip optical alignment.

13. A method for fabricating a test assembly for a semiconductor die comprising:

providing a substrate;

forming an electrically insulating polymer layer on the substrate;

forming a plurality of conductors on the polymer layer;

forming a mask on the substrate comprising a plurality of openings to the conductors corresponding to a pattern of contacts on the die;

forming microbumps on the conductors by depositing a metal in the openings, each microbump configured to electrically contact a contact on the die and to flex with the polymer layer to accommodate z-direction dimensional variations;

removing the masks;

providing a test fixture configured to test the die; and placing the substrate in the test fixture with the conductors in electrical communication with the test fixture.

14. The method as claimed in claim 13 wherein the substrate comprises silicon and the polymer layer comprises polyimide.

* * * * *